US006960946B2

(12) United States Patent
Messina et al.

(10) Patent No.: US 6,960,946 B2
(45) Date of Patent: Nov. 1, 2005

(54) LOW POWER, UP FULL SWING VOLTAGE CMOS BUS RECEIVER

(75) Inventors: Nathalie Messina, Nice (FR); Yves Leduc, Roquefort les Pina (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/860,522

(22) Filed: Jun. 3, 2004

(65) Prior Publication Data

US 2005/0077945 A1 Apr. 14, 2005

(30) Foreign Application Priority Data

Oct. 9, 2003 (EP) .................................. 03292504

(51) Int. Cl.[7] .............................................. H03B 1/00
(52) U.S. Cl. .......................... 327/112; 327/333; 326/81
(58) Field of Search ....................... 326/108–112, 379, 326/389, 391, 333, 427, 68, 70, 71, 80–83, 326/86, 26, 27

(56) References Cited

U.S. PATENT DOCUMENTS

| | | | |
|---|---|---|---|
| 6,204,696 B1 * | 3/2001 | Krishnamurthy et al. ...... | 326/83 |
| 6,236,244 B1 * | 5/2001 | Depetro et al. .............. | 327/108 |
| 6,344,758 B1 * | 2/2002 | Turner et al. ................. | 326/86 |
| 6,750,695 B2 * | 6/2004 | Blodgett et al. ............ | 327/333 |

OTHER PUBLICATIONS

"Novel Low-Swing Bus-Drivers and Charge-Recycle Architectures", M. Karlsson, et al., Signal Processing Systems, 1997, SIPS 97—Design and Implementation, 1997 IEEE Workshop on Leicester, UK Nov. 3-5, 1997, New York, NY, USA, IEEE, US, Nov. 3, 1997, pp. 141-150, XP010249774, ISBN: 0-7803-3806-5.

"Low-Swing Charge Recycle Bus Drivers", M. K. Karlsson, et al., Circuits and Systems, 1998, ISCAS '98, Proceedings of the 1998 IEEE International Symposium on Monterey, CA, USA, May 31-Jun. 3, 1998, New York, NY, USA, IEEE, US, May 31, 1998, pp. 117-120, XP010289127, ISBN: 0-7803-4455-3.

(Continued)

*Primary Examiner*—Long Nguyen
(74) *Attorney, Agent, or Firm*—Ronald O. Neerings; Wade James Brady, III; Frederick J. Telecky, Jr.

(57) ABSTRACT

A CMOS bus receiver for converting a reduced voltage swing input signal at an input node to a higher voltage swing output signal at an output node. The receiver includes a first and a second MOS transistor connected in series by their source and drain between a first side and a second side of a power supply, a gate of the first MOS transistor being connected to the input node, the common connection node of the first and second MOS transistors being connected to the output node. A third and a fourth MOS transistor connected in series by their source and drain between the first side of the power supply and the input node are also provided, a gate of the third MOS transistor being connected to the output node, and a gate of the second MOS transistor being connected to the common connection node of the third and fourth MOS transistors. A fifth MOS transistor is provided, connected in series by a source and drain with a diode between the first side of the power supply and the input node, a gate of the fourth MOS transistor being connected to the common connection node of the fifth MOS transistor and the diode. An inverter has an input connected to the output node and an output connected to a gate of the fifth MOS transistor.

4 Claims, 2 Drawing Sheets

OTHER PUBLICATIONS

"A Novel Reduced Swing CMOS Bus Interface Circuit for High Speed Low Power VLSI Systems", R. Golshan, et al., Circuits and Systems, 1994, ISCAS '94, 1994 IEEE International Symposium on London, UK, May 30-Jun. 2, 1994, New York, NY, USA, IEEE, May 30, 1994, pp 351-354, XP01043277, ISBN: 0-7803-1915-X.

"Low-Power CMOS/BICMOS Drivers and Receivers for On-Chip Interconnects", A. Bellaouar, et al., IEEE Journal of Solid-State Circuits, IEEE Inc., New York, US, vol. 30, No. 6, Jun. 1, 1995, pp. 696-700, XP000510122, ISSN: 0018-9200.

"An Efficient Low-Power Bus Architecture", A. Rjoub, et al., Circuits and Systems, 1997, ISCAS '97, Proceedings of 1997 IEEE International Symposium on Hong Kong Jun. 9-12, 1997, New York, NY, USA, IEEE, US, Jun. 9, 1997, pp. 1864-1867, XP010236593, ISBN: 0-7803-3583-X.

"Efficient Drivers, Receivers and Repeaters for Low Power CMOS Bus Architectures", A. Rjoub, et al., Electronics, Circuits and Systems, 1999, Proceedings of ICECS '99, The 6th IEEE International Conference on PAFOS, Cyprus Sep. 5-8, 1999, Piscataway, NJ, USA, IEEE, US, Sep. 5, 1999, pp. 789-794, XP010361610, ISBN: 0-7803-5682-9.

* cited by examiner

LOW POWER, UP FULL SWING VOLTAGE CMOS BUS RECEIVER

This application claims priority under 35 USC § (e)(1) of European Application Number 03292504.2, filed on Oct 9, 2003.

TECHNICAL FIELD OF THE INVENTION

This invention relates to bus receiver circuits, and more particularly relates to bus receiver circuits of the up full swing voltage type.

BACKGROUND OF THE INVENTION

Over the past years in the field of semiconductor circuits, clock speeds have generally increased, while at the same time demands have increased for ever lower power consumption by such circuits, as semiconductor circuits have found increasing uses in portable applications, where battery drain is an issue. An area of significant concern relates to busses, which are conduction lines that generally gather and distribute signals to and from a multiplicity of sources and targets. These conductors tend to have relatively high reactance, due to their size, and therefore require significant current to drive signals with sufficient speed to meet the performance requirements of the circuits in which they are used. While conventional driver circuits may have very low static power dissipation, nonetheless, when driving such high reactance buses the dynamic power dissipation can be considerable.

One solution to this problem is to provide for reduced voltage swing drivers to the buses, while providing receivers for bus signals that translate the low bus voltage swing signals to the level required by the receiving circuitry. For discussions of this approach, see, e.g., "A Novel Reduced Swing CMOS BUS Interface Circuit for high speed low power VLSI systems," by R. Golshan and B. Haroun, 1994 IEEE International Symposium on Circuits and Systems, ISCAS 1994, Vol. 4, London, England, U.K., May 30–Jun. 2, 1994, pages 351–354, and "Low-Power CMOS/BiCMOS Drivers and Receivers for On-Chip Interconnects," by A. Bellaouar, I. S. Abu-Khater and M. I. Elmasry, IEEE Journal of Solid-State Circuits, Vol. 30, No. 6., June 1995, pages 696–700, "An Efficient Low-Power Bus Architecture," by A. Rjoub, S. Nikolaidis, O. Koufopavlou and T. Stouraitis, 1997 IEEE International Symposium on Circuits and Systems, Jun. 9–12, 1997, Hong Kong, pages 1864–1867, and "Efficient Drivers, Receivers and Repeaters for Low Power CMOS Bus Architectures," by A. Rjoub and O. Koufopavlou, Proceedings of ICECS, Vol. 2, IEEE 1999, pages 789–794.

One of the receiver circuits developed to translate the low bus voltage swing signals to the level required by the receiving circuitry using this approach is the "up full swing voltage" receiver. Such a receiver is described in the article, cited above, by A. Bellaouar et al. FIG. 1a is the same as FIG. 4a of that article, and shows such a receiver. This circuit is designed to convert an input signal Vin having a reduced swing, e.g. having a high level of Vdd–Vtn and a low level of ground (GND) to an output signal Vout having full swing, where Vdd is the power supply voltage and Vtn is the threshold voltage of an N-type MOS device in the circuit. The diode D in the circuit of FIG. 1a may be implemented as a PMOS transistor having its gate connected to its drain. A problem with the circuit of FIG. 1a is that when the voltage of Vin is less than Vdd–Vtn, a static current flows in the path including diode D and PMOS transistor P11. Thus, in low voltage applications, undesirable static power is wasted, which is contrary to the purpose of low voltage circuit design.

SUMMARY OF THE INVENTION

The present invention overcomes the problem of static power consumption in low power up full swing voltage CMOS bus receiver circuits. In accordance with the present invention there is provided a CMOS bus receiver for converting a reduced voltage swing input signal at an input node to a higher voltage swing output signal at an output node. The receiver includes a first and a second MOS transistor connected in series by their source and drain between a first side and a second side of a power supply, a gate of the first MOS transistor being connected to the input node, the common connection node of the first and second MOS transistors being connected to the output node. A third and a fourth MOS transistor connected in series by their source and drain between the first side of the power supply and the input node are also provided, a gate of the third MOS transistor being connected to the output node, and a gate of the second MOS transistor being connected to the common connection node of the third and fourth MOS transistors. A fifth MOS transistor is provided, connected in series by a source and drain with a diode between the first side of the power supply and the input node, a gate of the fourth MOS transistor being connected to the common connection node of the fifth MOS transistor and the diode. An has an input connected to the output node and an output connected to a gate of the fifth MOS transistor.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 1A:
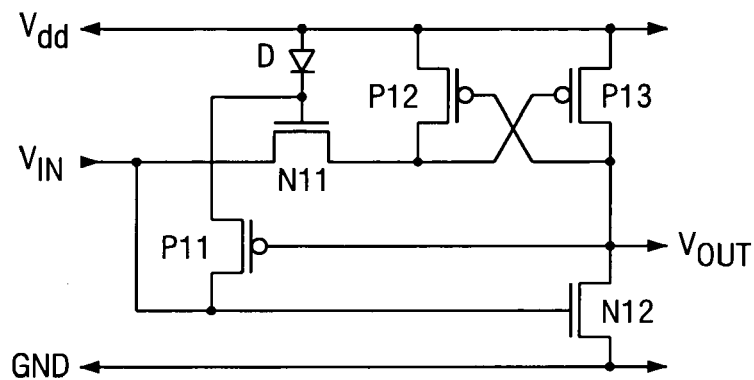
FIG. 1a is a schematic diagram of a prior art up full swing voltage CMOS bus receiver circuit.
Figure 1B:
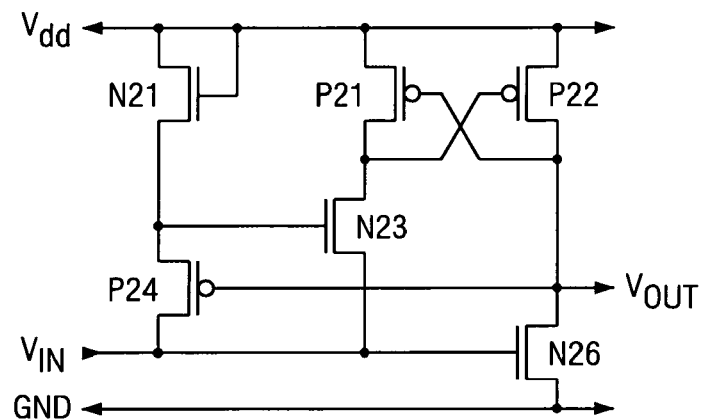
FIG. 1b is a schematic diagram of the circuit of FIG. 1a in which D1 is implemented an NMOS transistor.

To aid in better understanding the various embodiments of our invention, the circuit of FIG. 1a will now be described in more detail. This circuit has been redrawn in equivalent FIG. 1b, in which transistors have been renumbered and diode D1 implemented by an electrically equivalent NMOS transistor N21. In the circuit of FIG. 1b, when the voltage on node Vin is high but lower than Vdd−Vtn, a static current flows from the Vdd node to node Vin through transistors N21 and P24. To limit a parasitic bootstrap by coupling on the drain of this NMOS transistor N21, a big capacitance on this node is recommended. Also recommended is to use a large transistor to realize the transistor N21. However, neither of these expedients sufficiently limits static current flow.

Figure 2:
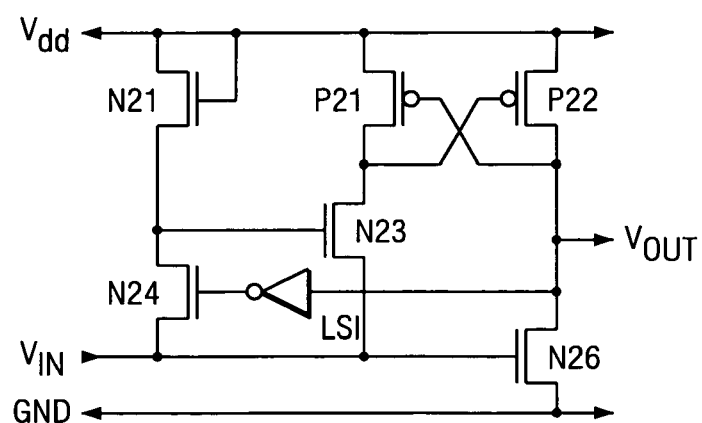
FIG. 2 is a schematic diagram of a first preferred embodiment of the present invention.

A purpose of our invention is to lower the input voltage limit below which a static current flows to Vdd−(2×Vtn). This is illustrated in the circuit of FIG. 2, which is a first preferred embodiment of our invention. In the circuit of FIG. 2, the PMOS transistor P24 of FIG. 1b is replaced by an NMOS transistor N24, and a low swing inverter LSI placed between the output node Vout and the gate of this transistor N24. The low swing inverter LSI is an inverter having an output voltage swing between Vdd−Vtn and GND. The association of the NMOS transistor N24 and the low swing inverter LSI provides the same functionality as the transistor P24 of FIG. 1a, but allows the input voltage Vin to reach the lower limit of Vdd−(2×Vtn) before a static current flows through transistors N21 and N24. Thus, the circuit of FIG. 2 provides the desired behavior.

Figure 3:
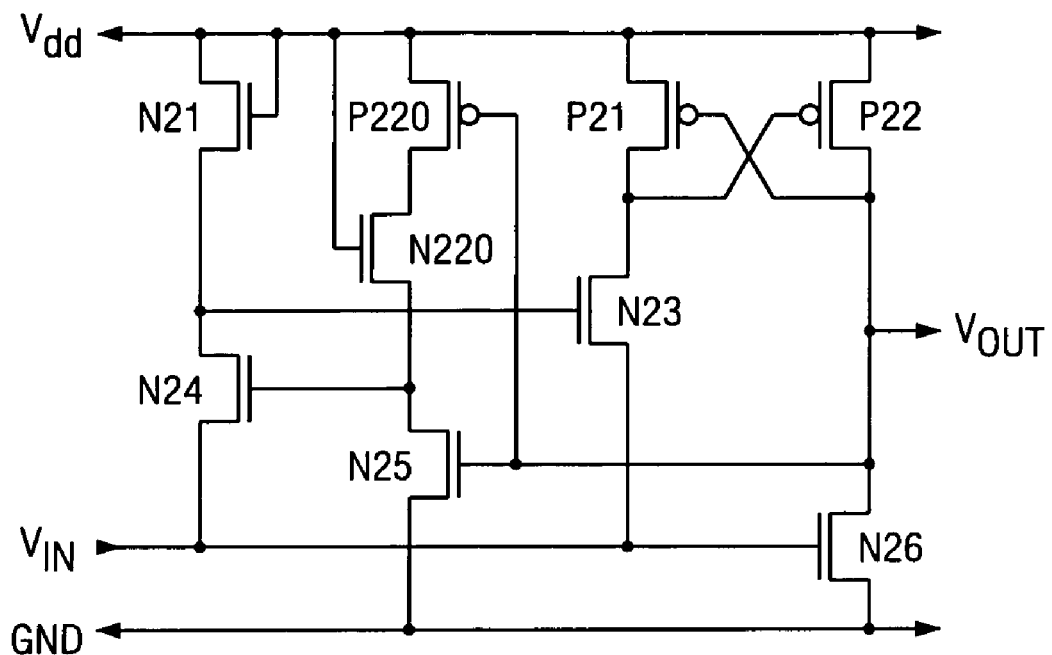
FIG. 3 is a schematic diagram of a second preferred embodiment of the present invention.

A second preferred embodiment of our invention, showing an implementation of the low swing inverter LSI of FIG. 2, is shown in FIG. 3. The inverter is implemented in this circuit as PMOS transistor P220 and two NMOS transistors in series, N220 and N25. The operation is as described above in connection with FIG. 2.

Although the goal of the invention is fully achieved in the embodiments shown in FIGS. 2 and 3, once the principles of our invention are understood, it will be readily apparent to those of ordinary skill in this art that other circuits implementing our invention can be readily devised. For example, a further preferred embodiment is shown in FIG. 4.

Figure 4:
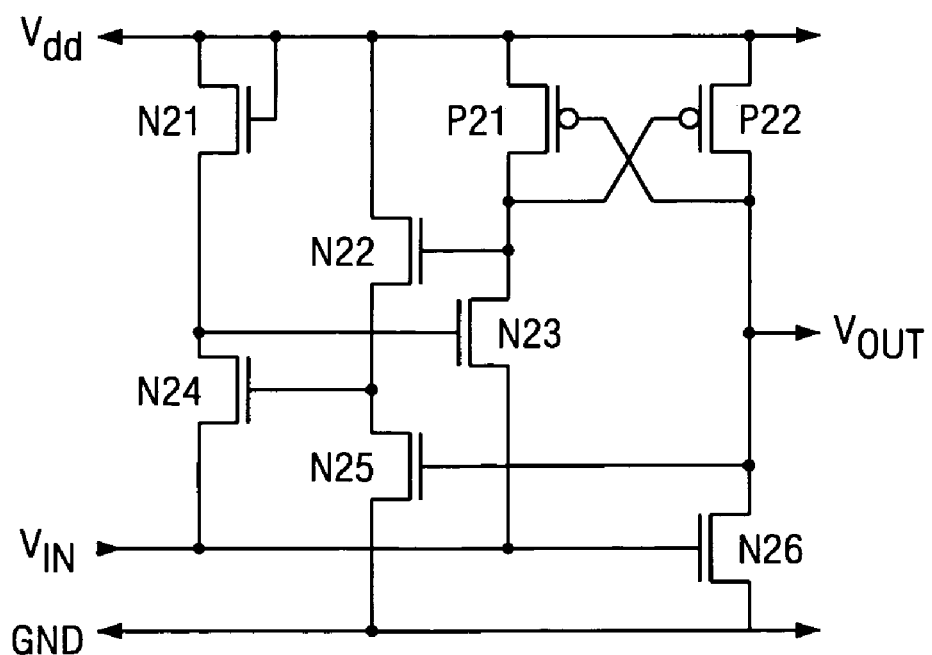
FIG. 4 is a schematic diagram of a third preferred embodiment of the present invention.

In FIG. 4, an N-channel MOS transistor N21 has its drain and gate connected together to configure transistor N21 as a diode, hereafter denominated diode D1, thus making the drain/gate of transistor N21 the anode of diode D1 and the source of transistor N21 the cathode of diode D1. The anode of diode D1 is connected to power supply Vdd. An N-channel MOS transistor N24 has its drain connected to the cathode of diode D1 and to the gate of an N-channel MOS transistor N23. The gate of transistor N24 is connected to the source of an N-channel MOS transistor N22, which is also connected to the drain of an N-channel transistor N25. The source of transistor N24 is connected to an input node Vin. The source of transistor N25 is connected to ground GND, and its gate is connected to an output node Vout. The drain of transistor N22 is connected to Vdd, while its gate is connected to the drain of a P-channel transistor P21, which is also connected to the gate of a P-channel transistor P22 and to the drain of transistor N23. The source of transistor N23 is connected to Vin, which is also connected to the gate of an N-channel transistor N26. The source of transistor P21 and the source of transistor P22 are connected to Vdd. The drain of transistor P22 is connected to the gate of transistor P21, to Vout, and to the drain of transistor N26. The source of transistor N26 is connected to GND.

In this circuit, the gate of the NMOS transistor N22 is advantageously connected to the drain of the PMOS transistor P21. The transistor N22 is now performing two functions: switching and limiting the voltage swing of the inverter.

Thus, our invention, for example as implemented in the circuits of FIGS. 2, 3 and 4, realizes a novel low power, up full swing voltage CMOS bus receiver with a reduced input voltage dynamic range. Input voltage swing in implementations of our invention may now have an Input voltage low that is smaller than Vtn and an input voltage high that is larger than (Vdd−2×Vtn). This may be advantageously compared to the current state of the art in which input voltage high must be larger than Vdd−Vtn.

Although the present invention and its advantages have been described in detail, it should be understood that various changes, substitutions and alterations can be made herein without departing from the spirit and scope of the invention as defined by the appended claims.

What is claimed is:

1. A CMOS bus receiver for converting a first voltage swing input signal at an input node to a second voltage swing output signal, having a greater voltage swing than the first voltage swing, at an output node, comprising:
    a first and a second MOS transistor connected in series by their source and drain between a first side and a second side of a power supply, a gate of the first MOS transistor being connected to the input node, the common connection node of the first and second MOS transistors being connected to the output node;
    a third and a fourth MOS transistor connected in series by their source and drain between the first side of the power supply and the input node, a gate of the third MOS transistor being connected to the output node, and a gate of the second MOS transistor being connected to the common connection node of the third and fourth MOS transistors;
    a fifth MOS transistor connected in series by a source and drain with a diode between the first side of the power supply and the input node, a gate of the fourth MOS transistor being connected to the common connection node of the fifth MOS transistor and the diode; and
    an inverter having an input connected to the output node and an output connected to a gate of the fifth MOS transistor.

2. A CMOS bus receiver as in claim 1, wherein the diode comprises a sixth MOS transistor having a gate connected to a source or drain thereof.

3. A CMOS bus receiver as in claim 1, wherein the inverter comprises:
    a sixth and a seventh MOS transistor connected in series by a source and drain between the first side of the power supply and the gate of the fifth MOS transistor, a gate of the sixth MOS transistor, being connected to the first side of the power supply, and a gate of the seventh MOS transistor being connected to the output node; and
    an eighth MOS transistor connected by a source and drain between the gate of the fifth transistor and the second side of the power supply, and having a gate connected to the output node.

4. A CMOS bus receiver as in claim 1, wherein the inverter comprises:
    a sixth MOS transistor connected by a source and drain between the first side of the power supply and the gate of the fifth MOS transistor, and having a gate connected to the common connection node of the third and fourth MOS transistors; and
    a seventh MOS transistor connected by a source and drain between the gate of the fifth transistor and the second side of the power supply, and having a gate connected to the output node.

* * * * *